US011199921B2

(12) United States Patent
Zhang et al.

(10) Patent No.: US 11,199,921 B2
(45) Date of Patent: Dec. 14, 2021

(54) TOUCH DISPLAY PANEL AND DETECTION METHOD THEREOF, AND TOUCH DISPLAY APPARATUS

(71) Applicants: Chongqing BOE Display Technology Co., Ltd., Chongqing (CN); BOE Technology Group Co., Ltd., Beijing (CN)

(72) Inventors: Wei Zhang, Beijing (CN); Hui Li, Beijing (CN); Shicheng Sun, Beijing (CN); Xinwei Wu, Beijing (CN); Cunzhi Li, Beijing (CN); Jonguk Kwak, Beijing (CN); Jian Guo, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/934,039

(22) Filed: Jul. 21, 2020

(65) Prior Publication Data
US 2021/0096677 A1 Apr. 1, 2021

(30) Foreign Application Priority Data
Sep. 26, 2019 (CN) .......................... 201910918319.5

(51) Int. Cl.
*G09G 3/3266* (2016.01)
*G06F 3/041* (2006.01)
(Continued)

(52) U.S. Cl.
CPC ........ *G06F 3/0412* (2013.01); *G02F 1/13338* (2013.01); *G06F 3/0416* (2013.01);
(Continued)

(58) Field of Classification Search
CPC ... G06F 3/0412; G06F 3/0416; H01L 27/323; G09G 3/3688; G09G 3/3266; G09G 3/3677; G09G 3/3275; G02F 1/13338
See application file for complete search history.

(56) References Cited

U.S. PATENT DOCUMENTS

2007/0170949 A1* 7/2007 Pak ........................ G09G 3/006
324/760.01
2008/0170195 A1* 7/2008 Kwon ................. G02F 1/13338
349/143
(Continued)

*Primary Examiner* — Jeff Piziali
(74) *Attorney, Agent, or Firm* — Ling Wu; Stephen Yang; Ling and Yang Intellectual Property

(57) ABSTRACT

Provided are a touch display panel and a detection method thereof, and a touch display apparatus. The touch display panel includes a display structure layer, a touch structure layer, a touch detection circuit and a detection signal line. The display structure layer includes a plurality of data lines, and the touch structure layer includes a plurality of touch signal lines. A timing of the touch display panel includes a detection stage. The touch detection circuit is connected with touch signal lines, data lines and the detection signal line, and is configured to provide, in the detection stage, a signal of the touch signal line to a data line under a control of a detection signal of the detection signal line, to detect the touch signal line according to a light emission state of pixel units to which the data line is connected.

13 Claims, 3 Drawing Sheets

(51) Int. Cl.
  *G02F 1/1333* (2006.01)
  *G09G 3/3275* (2016.01)
  *G09G 3/36* (2006.01)
  *H01L 27/32* (2006.01)

(52) U.S. Cl.
  CPC ......... *G09G 3/3266* (2013.01); *G09G 3/3275* (2013.01); *G09G 3/3677* (2013.01); *G09G 3/3688* (2013.01); *H01L 27/323* (2013.01)

(56) References Cited

U.S. PATENT DOCUMENTS

| | | | |
|---|---|---|---|
| 2014/0320761 A1* | 10/2014 | Misaki | G06F 3/0443 349/12 |
| 2016/0293077 A1* | 10/2016 | Ma | G09G 3/006 |
| 2016/0351093 A1* | 12/2016 | Kim | G09G 3/2092 |
| 2016/0364068 A1* | 12/2016 | Cheng | G09G 3/006 |
| 2019/0087029 A1* | 3/2019 | Shepelev | G06F 1/1643 |
| 2019/0197932 A1* | 6/2019 | Asatani | G06F 3/044 |

* cited by examiner

In a detection stage, providing a detection signal to the detection signal line and providing a first signal to touch signal lines; and under a control of the detection signal of the detection signal line, a touch detection circuit makes at least one of the plurality of touch signal lines and at least one of the plurality of data lines electrically conduct ⎯⎯ 100

Detecting, according to a light emission state of pixel units to which the at least one of the plurality of data lines is connected, whether an open circuit or a short circuit occurs in the at least one of the plurality of touch signal lines ⎯⎯ 200

FIG. 4

TOUCH DISPLAY PANEL AND DETECTION METHOD THEREOF, AND TOUCH DISPLAY APPARATUS

CROSS-REFERENCE TO RELATED APPLICATION

This application claims the priority of Chinese Patent Application No. 201910918319.5 filed to the CNIPA on Sep. 26, 2019, the content of which is hereby incorporated by reference.

TECHNICAL FIELD

Embodiments of the present disclosure relate to, but are not limited to, the field of touch control technology, in particular to a touch display panel and a detection method thereof, and a touch display apparatus.

BACKGROUND

Active Matrix Organic Light-Emitting Diode (AMOLED) displays are characterized by fast response, high brightness, low power consumption, good viewing angle, flexible display, etc., and have increasingly become the mainstream of the development of display technology. An AMOLED display with a touch control function is produced based on the demand of function diversification, including a touch structure layer and a display structure layer. Touch control technologies include an On Cell touch control technology and an In Cell touch control technology. In the On Cell technology, a touch structure layer is embedded in an encapsulation layer of a display.

SUMMARY

The following is a summary of the subject matter described in detail in the present disclosure. This summary is not intended to limit the protection scope of the claims.

An embodiment of the present disclosure provides a touch display panel, and the touch display panel includes: a display structure layer, a touch structure layer, a touch detection circuit and a detection signal line, the display structure layer includes a plurality of data lines, the touch structure layer includes a plurality of touch signal lines.

Herein, the touch detection circuit is connected with at least one of the plurality of touch signal lines, at least one of the plurality of data lines and the detection signal line, and is configured to, under a control of a detection signal of the detection signal line, make at least one of the plurality of touch signal lines and at least one of the plurality of data lines electrically conduct to detect whether an open circuit or a short circuit occurs in the at least one of the plurality of touch signal lines according to a light emission state of pixel units to which the at least one of the plurality of data lines is connected.

In some possible implementations, the touch detection circuit includes: a plurality of gating switches, the plurality of gating switches being in one-to-one correspondence with the touch signal lines.

In some possible implementations, the gating switch is a transistor.

Herein, a control electrode of the transistor is connected with a detection signal line, a first electrode of the transistor is connected with a corresponding touch signal line, and a second electrode of the transistor is connected with a data line; a different transistor is connected with a different data line.

In some possible implementations, the plurality of touch signal lines include a plurality of sensing signal lines and a plurality of driving signal lines, and at least one of the plurality of sensing signal lines and at least one of the plurality of driving signal lines are respectively electrically connected with at least one data line under a control of the touch detection circuit.

In some possible implementations, the plurality of driving signal lines include N driving signal lines, the plurality of sensing signal lines include M sensing signal lines, both N and M being a natural number greater than 1.

In some possible implementations, the data lines are divided into (N+M) groups by wiring positions, and the N driving signal lines and the M sensing signal lines are respectively connected with the data lines in an order as follows: an i-th driving signal line is electrically connected with one or more data lines of an i-th group of data lines; $1 \leq i \leq N$; and a j-th sensing signal line is electrically connected with one or more data lines of an (N+j)-th group of data lines; $1 \leq j \leq M$.

In some possible implementations, the data lines are divided into (N+M) groups by wiring positions, and the N driving signal lines and the M sensing signal lines are respectively connected with the data lines in an order as follows: an x-th driving signal line is electrically connected with one or more data lines of an x-th group of data lines, $1 \leq x \leq N/2$, x being an integer; a y-th sensing signal line is electrically connected with one or more data lines of an ([N/2]+y)-th group of data lines, $1 \leq y \leq M/2$, y being an integer; an ([N/2]+x)-th driving signal line is electrically connected with one or more data lines of an ([N/2]+[M/2]+x)-th group of data lines; and an ([M/2]+y)-th sensing signal line is electrically connected with one or more data lines of an (N+[M/2]+y)-th group of data lines.

In some possible implementations, the data lines are divided into X groups by colors of pixel units, X being a natural number greater than 1, and the N driving signal lines and the M sensing signal lines are respectively connected with the data lines in an order as follows: the N driving signal lines are electrically connected with one or more data lines of a first group to an A-th group of the X groups of data lines, A being a natural number between 1 and (X−1); and the M sensing signal lines are electrically connected with one or more data lines of an (A+1)-th group to an X-th group of the X groups of data lines.

In some possible implementations, the touch structure layer further includes a barrier layer, a connecting layer, an insulating layer, an electrode layer and a protective layer which are disposed on the display structure layer.

The connecting layer includes a plurality of connecting bridges.

The electrode layer includes: a driving electrode and a sensing electrode; the driving electrode and the sensing electrode are a metal grid structure, one of the driving electrode and the sensing electrode includes a plurality of first sub-touch electrodes arranged in a first direction, adjacent first sub-touch electrodes are bridged by a connecting bridge, the other of the driving electrode and the sensing electrode includes a plurality of second sub-touch electrodes arranged in a second direction, and any two adjacent second sub-touch electrodes are connected with each other in the second direction.

The insulating layer is configured to insulate the driving electrode and the sensing electrode from each other.

The driving electrode is electrically connected with a driving signal line, and the sensing electrode is connected with a sensing signal line.

In some possible implementations, materials of the driving electrode and the sensing electrode are at least one of copper, silver, aluminum, titanium and nickel.

In some possible implementations, the display structure layer includes a liquid crystal display element layer or an organic light emitting diode element layer.

An embodiment of the present disclosure further provides a touch display apparatus. The touch display apparatus includes any one of the above-described touch display panels.

An embodiment of the present disclosure further provides a detection method for a touch display panel, which is used for any one of the above-described touch display panels. The method includes: in a detection stage, providing a detection signal to a detection signal line and providing a first signal to a touch signal line; and under a control of a detection signal of the detection signal line, a touch detection circuit make at least one of the plurality of touch signal lines and at least one of the plurality of data lines electrically conduct to detect whether an open circuit or a short circuit occurs in the touch signal line according to a light emission state of pixel units to which the at least one of the plurality of data line is connected.

In some possible implementations, the method further includes: in a touch stage, providing a second signal to a touch signal line.

In some possible implementations, providing a first signal to a touch signal line includes: providing a first signal having a high-level potential to the touch signal line when the touch display panel is in a black screen state, or providing a first signal having a low-level potential to the touch signal line when the touch display panel is in a bright screen state.

In some possible implementations, a first signal of touch signal lines is provided to data lines, which includes: sequentially providing a first signal of the touch signal lines to the data lines at preset position intervals from left to right or from right to left according to wiring positions of the data lines, a preset position interval being b data lines, b being an integer greater than or equal to 0.

Other aspects will become apparent upon reading and understanding the brief description of the drawings and the embodiments of the present disclosure.

BRIEF DESCRIPTION OF DRAWINGS

Accompanying drawings are used to facilitate understanding of technical solutions of embodiments of the present disclosure and form a part of the specification, and explain the technical solutions of the present disclosure together with the embodiments of the present disclosure, which do not constitute a limitation on the technical solutions of the embodiments of the present disclosure.

FIG. 4 is an exemplary flowchart of a detection method for a touch display panel according to an embodiment of the present disclosure.

DETAILED DESCRIPTION

Embodiments of the present disclosure will be described below in detail with reference to the accompanying drawings. It should be noted that the embodiments in the present disclosure and features in the embodiments can be combined with each other arbitrarily if there is no conflict.

Unless otherwise defined, technical terms or scientific terms used in the embodiments of the present disclosure shall have common meanings as construed by those of ordinary skills in the art to which the present disclosure pertains. The words "first", "second" and the like used in the embodiments of the present disclosure do not represent any order, quantity or importance, but are merely used to distinguish among different components. Similar words such as "including" or "comprising" mean that elements or articles preceding the words cover elements or articles listed after the words and their equivalents, and do not exclude other elements or articles.

Those skilled in the art may understand that transistors used in the embodiments of the present disclosure may be thin film transistors or field effect transistors or other devices with same characteristics. The thin film transistor used in the embodiments of the present disclosure may be an oxide semiconductor transistor. Since a source and a drain of a transistor used here are symmetrical, the source and the drain may be interchanged. In the embodiments of the present disclosure, one of two electrodes is referred to as a first electrode and the other electrode is referred to as a second electrode in order to distinguish the two electrodes of the transistor other than a gate. The first electrode may be a source or a drain, and the second electrode may be a drain or a source.

A touch structure layer includes: touch signal lines including a plurality of driving signal lines Tx and a plurality of sensing signal lines Rx. The touch signal lines are usually formed in a stage of Flexible Multi-layer On Cell Touch (FMLOC) process. However, the FMLOC process may cause an open circuit or a short circuit in touch signal lines, and in AMOLED display screens provided by some technologies, an open circuit or a short circuit in touch signal lines cannot be detected.

Figure 1:
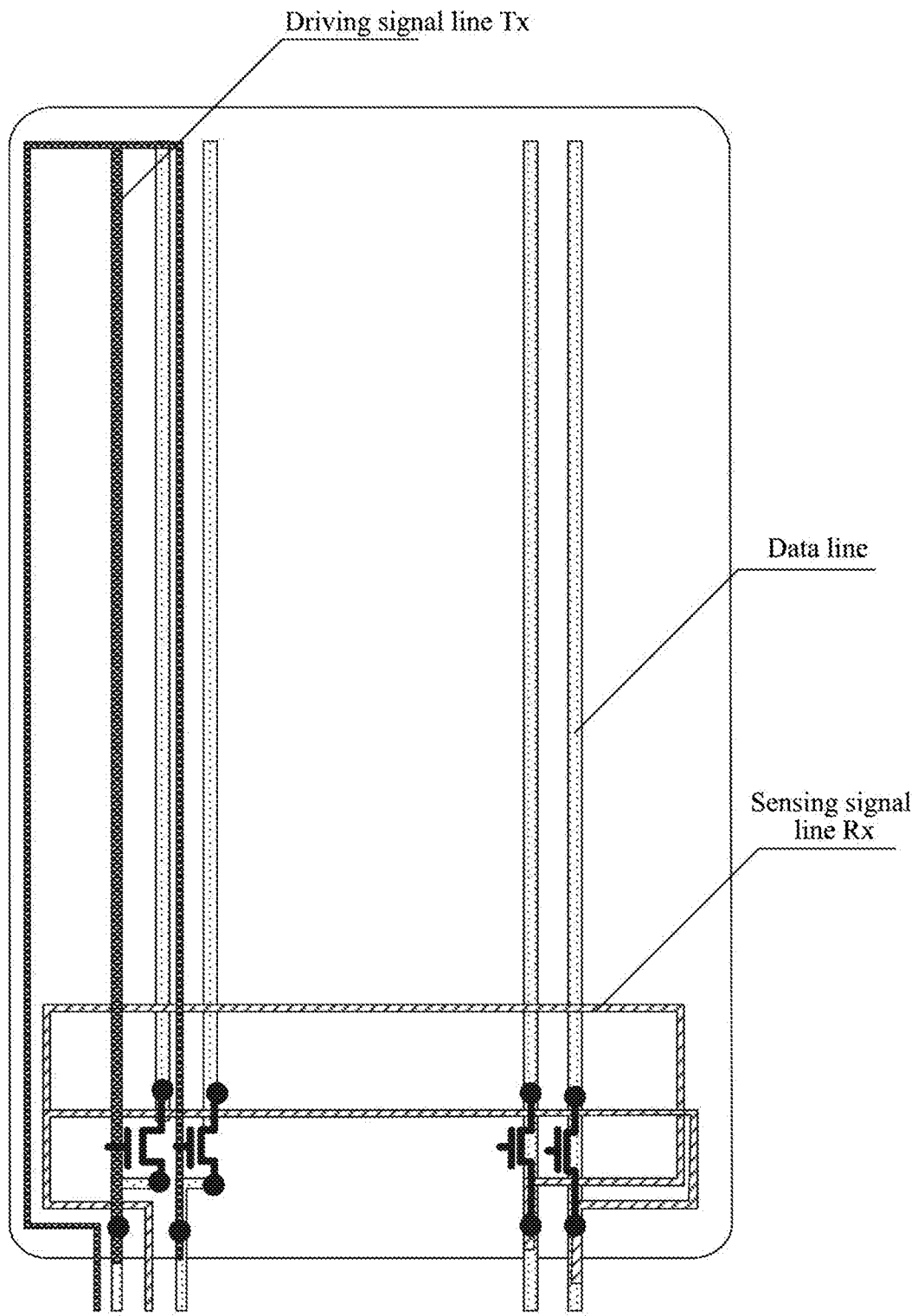
FIG. 1 is a schematic diagram of a wiring structure of a touch display panel according to an embodiment of the present disclosure.
Figure 2:
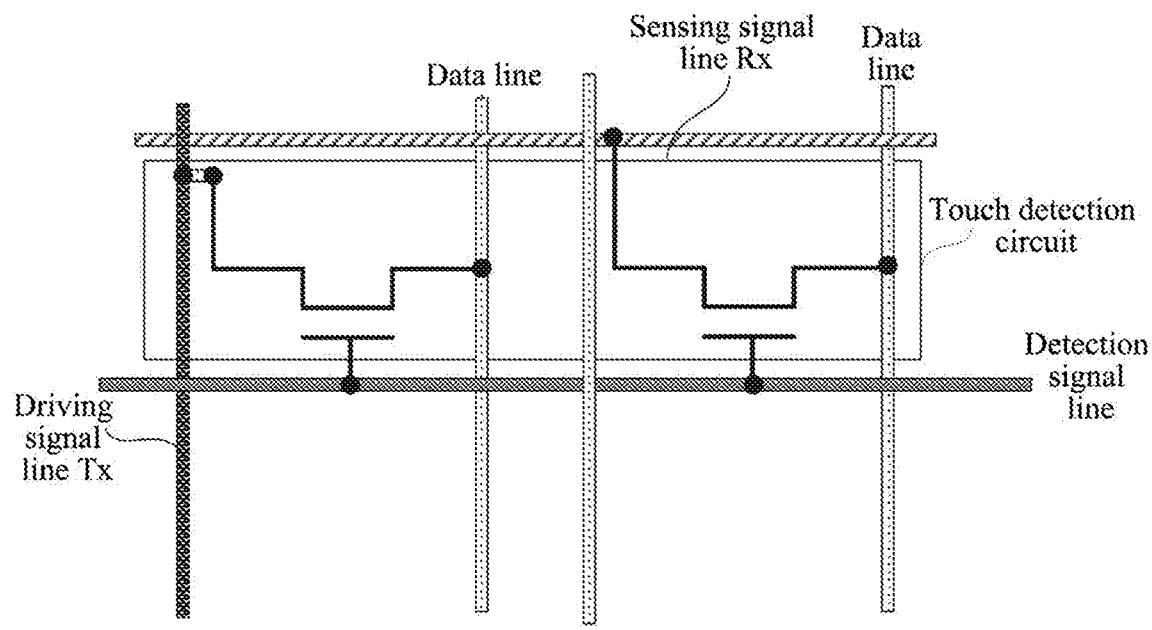
FIG. 2 is a schematic diagram of a structure of a touch detection circuit according to an embodiment of the present disclosure.

As shown in FIGS. 1 and 2, an embodiment of the present disclosure provides a touch display panel, the touch display includes: a display structure layer, a touch structure layer, a touch detection circuit and a detection signal line. The display structure layer includes a plurality of data lines. The touch structure layer includes a plurality of touch signal lines.

The touch detection circuit is connected with at least one of the plurality of touch signal lines, at least one of the plurality of data lines and the detection signal line, and is configured to, under a control of a detection signal of the detection signal line, make at least one of the plurality of touch signal lines and at least one of the plurality of data lines electrically conduct to detect whether an open circuit or a short circuit occurs in the at least one of the plurality of touch signal lines according to a light emission state of pixel units to which the at least one of the plurality of data lines is connected.

In an exemplary embodiment, the touch structure layer may be a self-capacitance touch structure or a mutual capacitance touch structure.

In an exemplary embodiment, the display structure layer may include a liquid crystal display element layer.

In another exemplary embodiment, the display structure layer according to an embodiment of the present disclosure may include an organic light-emitting diode element layer to realize foldability of a touch display substrate.

When the display structure layer is an organic light-emitting diode display structure, the display structure layer in the touch display substrate according to an embodiment of the present disclosure may include: a flexible organic light emitting diode element layer and an encapsulation layer. Herein, the flexible organic light-emitting diode element layer includes: a thin film transistor structure layer, a capacitor layer and a light-emitting device layer.

Herein, there is an overlap region between an orthographic projection of the touch structure layer on a base substrate and an orthographic projection of a flexible organic light emitting diode display substrate on the base substrate.

In an exemplary embodiment, the thin film transistor structure layer includes: a buffer layer, an active layer, a first gate insulating layer, a gate electrode, a second gate insulating layer, an interlayer insulating layer, a source-drain electrode layer, and a flat layer. The thin film transistor structure layer according to an embodiment of the present disclosure may be a top gate structure or a bottom gate structure.

In an exemplary embodiment, the capacitor layer includes: a first electrode layer and a second electrode layer. Herein, the first electrode layer and the gate electrode are formed by a same process.

In an exemplary embodiment, the light-emitting device layer may include: an anode, an organic light-emitting layer, and a cathode. Herein, the anode is connected with a drain electrode of the thin film transistor structure layer.

In an exemplary embodiment, the display structure layer includes a plurality of gate lines and a plurality of data lines, and pixel units arranged in a matrix shape are enclosed by adjacent gate lines and adjacent data lines, each pixel unit being provided with a pixel circuit for driving a light-emitting element to emit light. In order to provide a corresponding signal for a pixel circuit, a large number of wirings, e.g., gate lines, reset signal lines, data lines, and the like, need to be provided.

In an embodiment of the present disclosure, a touch detection circuit is connected with touch signal lines, data lines and a detection signal line, and in a detection stage, provides signals of the touch signal lines to the data lines under a control of a detection signal of the detection signal line. For example, when the touch display panel is in a black screen state, a high-level signal is provided sequentially to one or more touch signal lines. When one or more touch signal lines are disconnected, one or more vertical bright lines on the touch display panel can be observed (i.e., pixel units, to which data lines connected with the touch signal line(s) are connected, emit light). The disconnected touch signal line is a touch signal line connected with a data line where the vertical bright line appears. When the touch display panel is in a bright screen state (e.g., in a white screen state), a low-level signal is sequentially provided to one or more touch signal lines. When there is a short circuit between two or more touch signal lines, on the touch display panel, a dark line may be observed at a position of one or more data lines to which the touch signal lines are connected (i.e., pixel units, to which data lines connected with the two or more short-circuited touch signal lines are connected, do not emit light). The short-circuited touch signal lines are touch signal lines connected to data lines at the position of the dark lines.

In an exemplary embodiment, the touch detection circuit includes: a plurality of gating switches, the plurality of gating switches are in a one-to-one correspondence with the touch signal lines.

In an exemplary embodiment, the gating switch is a transistor. A control electrode of the transistor is connected with a detection signal line, a first electrode of the transistor is connected with a corresponding touch signal line, and a second electrode of the transistor is connected with a data line. A different transistor is connected to a different data line.

In an exemplary embodiment, a timing of the touch display panel includes: a detection stage and a touch stage. A signal provided by a touch signal line in the detection stage is a first signal, and a signal provided by a touch signal line in the touch stage is a second signal.

In an exemplary embodiment, in a module product stage of a touch display panel, the first signal or the second signal may be provided using a touch chip; and in a Cell stage of a touch display panel, the first signal or the second signal may be provided using a touch signal source generator.

In an exemplary embodiment, the plurality of touch signal lines include a plurality of sensing signal lines and a plurality of driving signal lines. At least one of the plurality of sensing signal lines and at least one of the plurality of driving signal lines are respectively electrically connected with at least one data line under a control of the touch detection circuit.

In an exemplary embodiment, the plurality of driving signal lines are N driving signal lines and the plurality of sensing signal lines are M sensing signal lines, both N and M being a natural number greater than 1.

A number N of driving signal lines Tx and a number M of sensing signal lines Rx may be determined according to a screen size and an aspect ratio of an actual touch display panel. For example, in a 6-inch touch display screen, there are generally 16 driving signal lines Tx and 33 sensing signal lines Rx.

In an exemplary embodiment, the data lines are divided into (N+M) groups by wiring positions, and the N driving signal lines Tx and the M sensing signal lines Rx are respectively connected with the data lines in an order as follows: an i-th driving signal line is electrically connected with one or more data lines of an i-th group of data lines; $1 \le i \le N$; and a j-th sensing signal line is electrically connected with one or more data lines of a (N+j)-th group of data lines; $1 \le j \le M$.

In the embodiment, a first driving signal line is electrically connected with one or more data lines of a first group of data lines; a second driving signal line is electrically connected with one or more data lines of a second group of data lines; . . . a N-th driving signal line is electrically connected with one or more data lines of a N-th group of data lines; a first sensing signal line is electrically connected with one or more data lines of a (N+1)-th group of data lines; a second sensing signal line is electrically connected with one or more data lines of a (N+2)-th group of data lines; . . . an M-th sensing signal line is electrically connected with one or more data lines of an (N+M)-th group of data lines.

In an embodiment of the present disclosure, data lines in a display structure layer are divided into a left part and a right part, one part is allocated to the driving signal lines Tx, and the other part is allocated to the sensing signal lines Rx, so that a faulty touch signal line may be quickly located during detection.

In another exemplary embodiment, data lines are divided into (N+M) groups by wiring positions, and the N driving signal lines Tx and the M sensing signal lines Rx are respectively connected with the data lines in an order as follows: an x-th driving signal line is electrically connected with one or more data lines of an x-th group of data lines, $1 \leq x \leq N/2$, x being an integer; a y-th sensing signal line is electrically connected with one or more data lines of an ([N/2]+y)-th group of data lines, $1 \leq y \leq M/2$, y being an integer; an ([N/2]+x)-th driving signal line is electrically connected with one or more data lines of an ([N/2]+[M/2]+x)-th group of data lines; and an ([M/2]+y)-th sensing signal line is electrically connected with one or more data lines of an (N+[M/2]+y)-th group of data lines.

In the embodiment, a first driving signal line is electrically connected with one or more data lines of a first group of data lines; a second driving signal line is electrically connected with one or more data lines of a second group of data lines; . . . an [N/2]-th driving signal line is electrically connected with one or more data lines of an [N/2]-th group of data lines, herein, [ ] is a rounding symbol; a first sensing signal line is electrically connected with one or more data lines of an ([N/2]+1)-th group of data lines; a second sensing signal line is electrically connected with one or more data lines of an ([N/2]+2)-th group of data lines; . . . an [M/2]-th sensing signal line is electrically connected with one or more data lines of an ([N/2]+[M/2])-th group of data lines; an ([N/2]+1)-th driving signal line is electrically connected with one or more data lines of an ([N/2]+[M/2]+1)-th group of data lines; an ([N/2]+2)-th driving signal line is electrically connected with one or more data lines of an ([N/2]+[M/2]+2)-th group of data lines; . . . an N-th driving signal line is electrically connected with one or more data lines of an (N+[M/2])-th group of data lines; an ([M/2]+1)-th sensing signal line is electrically connected with one or more data lines of an (N+[M/2]+1)-th group of data lines; an ([M/2]+2)-th sensing signal line is electrically connected with one or more data lines of an (N+[M/2]+2)-th group of data lines; . . . an M-th sensing signal line is electrically connected with one or more data lines of an (N+M)-th group of data lines.

In an embodiment of the present disclosure, data lines in a display structure layer are divided into four parts from left to right, and each part is allocated to a part of the driving signal lines Tx or sensing signal lines Rx, so that a faulty touch signal line may be quickly located during detection.

In yet another exemplary embodiment, data lines are divided into X groups by colors of pixel units, herein, X is a natural number greater than 1; and the N driving signal lines Tx and M sensing signal lines Rx may be respectively connected with the data lines in an order as follows: the N driving signal lines Tx are respectively electrically connected with one or more data lines of a first group to an A-th group of the X groups of data lines, herein, A is a natural number between 1 and (X−1); and the M sensing signal lines Rx are respectively electrically connected with one or more data lines of an (A+1)-th group to an X-th group of the X groups of data lines.

In the embodiment of the present disclosure, the data lines in the display structure layer are first grouped by colors of pixel units, and then the driving signal lines Tx or sensing signal lines Rx are connected with data lines in a fixed group with a certain color. In this way, a faulty touch signal line may be quickly located by a color and a position of a vertical bright line or a vertical dark line appearing on the screen during detection.

In an exemplary embodiment, a pixel unit includes one or more of a red sub-pixel unit, a green sub-pixel unit, a blue sub-pixel unit, and a white sub-pixel unit.

For example, when a pixel unit includes sub-pixel units of three colors, i.e., a red sub-pixel unit, a green sub-pixel unit and a blue sub-pixel unit, a driving signal line Tx may be connected with a data line connected to the red sub-pixel unit, and a sensing signal line Rx may be connected with a data line connected to the green sub-pixel unit or the blue sub-pixel unit, so that when a red bright line appears on the screen, it may be quickly determined that there is a faulty point of open circuit in the driving signal line Tx, or when a blue bright line or a green bright line appears on the screen, it may be quickly determined that there is a faulty point of open circuit in the sensing signal line Rx.

Figure 3:
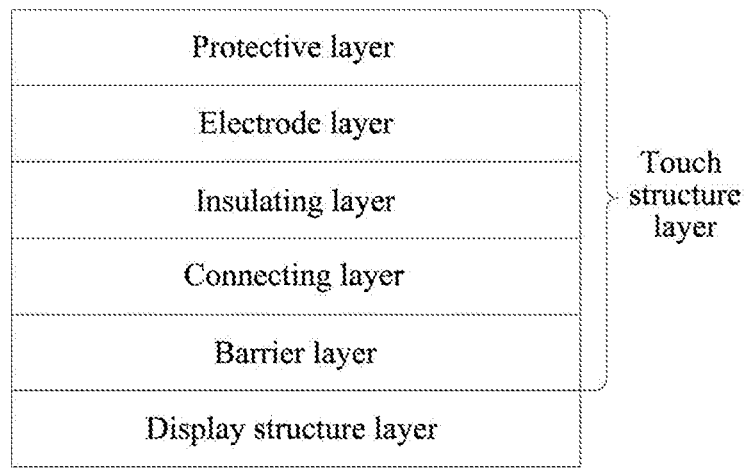
FIG. 3 is a schematic diagram of a film layer structure of a touch structure layer according to an embodiment of the present disclosure.

In an exemplary embodiment, as shown in FIG. 3, a touch structure layer includes a barrier layer, a connecting layer, an insulating layer, an electrode layer, and a protective layer which are disposed on the display structure layer.

The connecting layer includes a plurality of connecting bridges. The electrode layer includes a driving electrode and a sensing electrode. The driving electrode and the sensing electrode are a metal grid structure. One of the driving electrode and the sensing electrode includes a plurality of mutually independent first sub-touch electrodes arranged in a first direction, and adjacent first sub-touch electrodes are bridged by a connecting bridge; and the other of the driving electrode and the sensing electrode includes a plurality of second sub-touch electrodes arranged in a second direction, and any two adjacent second sub-touch electrodes are connected to each other in the second direction. The insulating layer is configured to insulate the driving electrode and the sensing electrode from each other.

The driving electrode is electrically connected with a driving signal line, and the sensing electrode is connected with a sensing signal line.

In an embodiment of the present disclosure, description is made by an example of the driving electrode and the sensing electrode being arranged on a same layer. However, the driving electrode and the sensing electrode may also be arranged in different layers, which is not limited in the embodiments of the present disclosure in any way.

In an exemplary embodiment, patterns of the metal grids of the driving electrode and the sensing electrode are the same. The patterns of the metal grids being the same refers that metal tracks of the metal grids have a same trend and a same line width.

In an exemplary embodiment, materials of the driving electrode and the sensing electrode may be at least one of copper (Cu), silver (Ag), aluminum (Al), Titanium (Ti) or nickel (Ni).

In an exemplary embodiment, materials of the driving electrode and the sensing electrode are the same material.

In an embodiment of the present disclosure, a metal grid is adopted as the touch electrode. Compared with an indium tin oxide material, a metal material has better ductility and is not easy to break, thus bending performance of the touch display panel may be improved to make the touch display panel be more suitable for realizing a flexible touch function, and cost may also be reduced. Moreover, the driving electrode and the sensing electrode are arranged on the same layer and made of the same material, and have a same pattern, so that a substrate is fully arranged with metal grids with the same pattern, which may solve problems of poor shadow elimination and optical moire caused by mutual interference of metal grids on different layers due to differences in line width and the like, and has better shadow elimination effect.

In an exemplary embodiment, the driving electrode includes a plurality of first sub-touch electrodes that are independent of each other. Adjacent first sub-touch electrodes are electrically connected through the connecting layer.

In an exemplary embodiment, the connecting layer includes at least one connecting electrode. A number of connecting electrodes may be defined according to an actual requirement.

In an exemplary embodiment, a material of the barrier layer may be silicon oxide, silicon nitride, or a composite of silicon oxide or silicon nitride.

In an exemplary embodiment, the barrier layer is located on one side of the touch structure layer close to the display structure layer.

In an exemplary embodiment, a material of the protective layer may be silicon oxide, silicon nitride, or a composite of silicon oxide or silicon nitride.

Some embodiments of the present disclosure further provide a detection method for a touch display panel, which is used for the touch display panels provided in the previous embodiments. As shown in FIG. 4, the detection method includes the following steps 100 and 200.

In step 100, in a detection stage, a detection signal is provided to a detection signal line and a first signal is provided to touch signal lines; the touch detection circuit makes at least one of the plurality of touch signal lines and at least one of the plurality of data lines electrically conduct under a control of the detection signal of the detection signal line.

In step 200, according to a light emission state of pixel units to which the at least one of the plurality of data lines is connected, whether an open circuit or a short circuit occurs in the at least one of the plurality of touch signal lines is detected.

In a manufacturing process of a display panel, a plurality of inspection procedures are required, among which a very important inspection procedure is to carry out a Cell Test on a liquid crystal cell after cutting to confirm whether there is a defect in the liquid crystal cell. The test is carried out when a driving chip and a flexible circuit board for inputting signals are not attached to the display panel. The process includes inputting a test signal to the display panel first to make the pixel units of the display panel present colors, and then observing, by a defect detection device, whether each pixel unit is in good condition one by one. This process is referred to as a Light-on Test. The detection method according to an embodiment of the present disclosure may be performed in a certain black screen or bright screen state in the Light-on Test.

In an exemplary embodiment, the method further includes: in a touch stage, providing a second signal to a touch signal line.

In an exemplary embodiment, providing the first signal to the touch signal line in the detection stage includes: providing a first signal having a high-level potential to the touch signal line in the detection stage when the touch display panel is in a black screen state, or providing a first signal having a low-level potential to the touch signal line in the detection stage when the touch display panel is in a bright screen state.

In this step, when the touch display panel is in a black screen state, the first signal provided to the touch signal line in the detection stage is a high-level signal, and when the touch display panel is in a bright screen state, the first signal provided to the touch signal line in the detection stage is a low-level signal.

When the touch display panel is in a black screen state, a high-level signal is sequentially provided to one or more touch signal lines. When there is a faulty point of open circuit in a touch signal line, the detection signal cannot be transmitted to a data line through the broken touch signal line, then a vertical bright line may be observed at a position where the data line is located (i.e., pixel units, to which the data line connected with the touch signal line is connected, emit light). If no vertical bright line is observed at a position of one or more data lines connected with a touch signal line, it is determined that there is no faulty point of open circuit in the touch signal line. When the touch display panel is in a bright screen state (e.g., in a white screen state), a low-level signal is sequentially provided to one or more touch signal lines. When there is a short circuit between two or more touch signal lines, on the touch display, a vertical dark line may be observed at a position of one or more data lines to which the two or more touch signal lines are connected (i.e., pixel units, to which data lines connected with the two or more short-circuited touch signal lines are connected, do not emit light). The short-circuited touch signal lines are touch signal lines to which the data lines at the position of the vertical dark lines are connected. If no vertical dark line is observed at a position on the touch display panel of one or more data lines to which a touch signal line is connected, it is determined that there is no short circuit problem in the touch signal line.

In an exemplary embodiment, the first signal of the touch signal lines is provided to data lines, which includes: sequentially providing the first signal of the touch signal lines to data lines at preset position intervals from left to right or from right to left according to wiring positions of the data lines, a preset position interval being b data lines, b being an integer greater than or equal to 0.

For example, in an embodiment of the present disclosure, an odd-numbered driving signal line Tx and an even-numbered driving signal line Tx, and an odd-numbered sensing signal line Rx and an even-numbered sensing signal line Rx may be separately tested according to an detection order of Tx1, Tx3, Tx5 . . . , Tx2, Tx4, Tx6 . . . and Rx1, Rx3, Rx5 . . . , Rx2, Rx4, Rx6 . . . In this way, it may be clearly detected whether there is a faulty point of open circuit between adjacent touch signal lines.

An embodiment of the present disclosure further provides a touch display apparatus, the touch display apparatus includes a touch display panel described in any one of the previous embodiments. The touch display apparatus may be any product or component with a touch display function such as a mobile phone, a tablet computer, a television, a display, a notebook computer, a digital photo frame, a navigator, etc.

In the touch display panel and the detection method thereof, and the touch display apparatus according to the embodiments of the present disclosure, a touch detection circuit is connected with a touch signal line, a data line and a detection signal line, under a control of a detection signal of the detection signal line, at least one of a plurality of touch signal lines and at least one of a plurality of data lines are electrically conducted, thus it is possible to detect an open circuit or a short circuit in a touch signal line, which improves display quality of the touch display panel.

The following several points need to be explained.

The accompanying drawings of the embodiments of the present disclosure only refer to structures involved in the embodiments of the present disclosure, and other structures may refer to general designs.

Without conflict, the embodiments of the present disclosure and the features of the embodiments may be combined with each other to obtain new embodiments.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope as defined by the appended claims.

What we claim is:

1. A touch display panel, comprising: a display structure layer, a touch structure layer, a touch detection circuit and a detection signal line, wherein the display structure layer comprises a plurality of data lines, and the touch structure layer comprises a plurality of touch signal lines;

the touch detection circuit is connected with at least one of the plurality of touch signal lines, at least one of the plurality of data lines and the detection signal line, and is configured to, under a control of a detection signal of the detection signal line, make at least one of the plurality of touch signal lines and at least one of the plurality of data lines electrically conduct to detect whether an open circuit or a short circuit occurs in at least one of the plurality of the touch signal lines according to a light emission state of pixel units to which at least one of the plurality of data lines is connected, wherein the plurality of touch signal lines comprise a plurality of sensing signal lines and a plurality of driving signal lines, and at least one of the plurality of sensing signal lines and at least one of the plurality of driving signal lines are respectively electrically connected with at least one data line under a control of the touch detection circuit, and wherein the plurality of driving signal lines comprise N driving signal lines, the plurality of sensing signal lines comprise M sensing signal lines, N and M are natural numbers greater than 1, the data lines are divided into (N+M) groups by wiring positions, and the N driving signal lines and the M sensing signal lines are respectively connected with the data lines in an order as follows:

an x-th driving signal line is electrically connected with one or more data lines of an x-th group of data lines, 1≤x≤N/2, and x is an integer;

a y-th sensing signal line is electrically connected with one or more data lines of an ([N/2]+y)-th group of data lines, 1≤y≤M/2, and y is an integer;

an ([N/2]+x)-th driving signal line is electrically connected with one or more data lines of an ([N/2]+[M/2]+x)-th group of data lines; and an ([M/2]+y)-th sensing signal line is electrically connected with one or more data lines of an (N+[M/2]+y)-th group of data lines.

2. The touch display panel according to claim 1, wherein the touch detection circuit comprises: a plurality of gating switches, the plurality of gating switches being in one-to-one correspondence with the touch signal lines.

3. The touch display panel according to claim 2, wherein a gating switch is a transistor;

wherein a control electrode of the transistor is connected with the detection signal line, a first electrode of the transistor is connected with a corresponding touch signal line, and a second electrode of the transistor is connected with a data line;

a different transistor is connected with a different data line.

4. The touch display panel according to claim 1, wherein the touch structure layer further comprises a barrier layer, a connecting layer, an insulating layer, an electrode layer and a protective layer which are disposed on the display structure layer;

the connecting layer comprises a plurality of connecting bridges;

the electrode layer comprises: a driving electrode and a sensing electrode; the driving electrode and the sensing electrode are a metal grid structure, one of the driving electrode and the sensing electrode comprises a plurality of mutually independent first sub-touch electrodes arranged in a first direction, adjacent first sub-touch electrodes are electrically connected by a connecting bridge, the other of the driving electrode and the sensing electrode comprises a plurality of second sub-touch electrodes arranged in a second direction, and any two adjacent second sub-touch electrodes are connected with each other in the second direction;

the insulating layer is configured to insulate the driving electrode and the sensing electrode from each other;

the driving electrode is electrically connected with a driving signal line; and the sensing electrode is connected with a sensing signal line.

5. The touch display panel according to claim 4, wherein materials of the driving electrode and the sensing electrode are at least one of copper, silver, aluminum, titanium or nickel.

6. The touch display panel according to claim 1, wherein the display structure layer comprises a liquid crystal display element layer or an organic light-emitting diode element layer.

7. A touch display apparatus having a touch display panel, the touch display panel comprising: a display structure layer, a touch structure layer, a touch detection circuit and a detection signal line, wherein the display structure layer comprises a plurality of data lines, and the touch structure layer comprises a plurality of touch signal lines;

the touch detection circuit is connected with at least one of the plurality of touch signal lines, at least one of the plurality of data lines and the detection signal line, and is configured to, under a control of a detection signal of the detection signal line, make at least one of the plurality of touch signal lines and at least one of the plurality of data lines electrically conduct to detect whether an open circuit or a short circuit occurs in the at least one of the plurality of touch signal lines according to a light emission state of pixel units to which the at least one of the plurality of data lines is connected, wherein the plurality of touch signal lines comprise a plurality of sensing signal lines and a plurality of driving signal lines, and at least one of the plurality of sensing signal lines and at least one of the plurality of driving signal lines being respectively electrically connected with at least one data line under a control of the touch detection circuit, and wherein the plurality of driving signal lines comprise N driving signal lines, the plurality of sensing signal lines comprise M sensing signal lines, N and M are natural numbers greater than 1, the data lines are divided into (N+M) groups by wiring positions, and the N driving signal lines and the M sensing signal lines are respectively connected with the data lines in an order as follows:

an x-th driving signal line is electrically connected with one or more data lines of an x-th group of data lines, 1<x<N/2, and x is an integer;

a y-th sensing signal line is electrically connected with one or more data lines of an ([N/2]+y)-th group of data lines, 1<y<M/2, and y is an integer;

an ([N/2]+x)-th driving signal line is electrically connected with one or more data lines of an ([N/2]+[M/2]+x)-th group of data lines; and an ([M/2]+y)-th sensing signal line is electrically connected with one or more data lines of an (N+[M/2]+y)-th group of data lines.

8. The touch display apparatus according to claim 7, wherein the touch detection circuit comprises: a plurality of gating switches, the plurality of gating switches being in one-to-one correspondence with the touch signal lines.

9. The touch display apparatus according to claim 8, wherein a gating switch is a transistor;

wherein a control electrode of the transistor is connected with the detection signal line, a first electrode of the transistor is connected with a corresponding touch signal line, and a second electrode of the transistor is connected with a data line;

a different transistor is connected with a different data line.

10. A detection method for a touch display panel having a display structure layer, a touch structure layer, a touch detection circuit and a detection signal line, wherein the display structure layer comprises a plurality of data lines; the touch structure layer comprises a plurality of touch signal lines, the touch detection circuit is connected with at least one of the plurality of touch signal lines, at least one of the plurality of data lines and the detection signal line, wherein the plurality of touch signal lines comprise a plurality of sensing signal lines and a plurality of driving signal lines, and at least one of the plurality of sensing signal lines and at least one of the plurality of driving signal lines are respectively electrically connected with at least one data line under a control of the touch detection circuit, and wherein the plurality of driving signal lines comprise N driving signal lines, the plurality of sensing signal lines comprise M sensing signal lines, N and M are natural numbers greater than 1, the data lines are divided into (N+M) groups by wiring positions, and the N driving signal lines and the M sensing signal lines are respectively connected with the data lines in an order as follows:

an x-th driving signal line is electrically connected with one or more data lines of an x-th group of data lines, 1<x<N/2, and x is an integer;

a y-th sensing signal line is electrically connected with one or more data lines of an ([N/2]+y)-th group of data lines, 1<y<M/2, and y is an integer;

an ([N/2]+x)-th driving signal line is electrically connected with one or more data lines of an ([N/2]+[M/2]+x)-th group of data lines; and an ([M/2]+y)-th sensing signal line is electrically connected with one or more data lines of an (N+[M/2]+y)-th group of data lines, the detection method comprising:

in a detection stage, providing a detection signal to the detection signal line and providing a first signal to touch signal lines; under a control of a detection signal of the detection signal line, controlling, by the touch detection circuit, at least one of the plurality of touch signal lines and at least one of the plurality of data lines to electrically conduct to detect whether an open circuit or a short circuit occurs in the at least one of the plurality of touch signal lines according to a light emission state of pixel units to which the at least one of the plurality of data lines is connected.

11. The detection method according to claim 10, further comprising: in a touch stage, providing a second signal to touch signal lines.

12. The detection method according to claim 10, wherein providing a first signal to touch signal lines comprises: providing a first signal having a high-level potential to the touch signal lines when the touch display panel is in a black screen state, or providing a first signal having a low-level potential to the touch signal lines when the touch display panel is in a bright screen state.

13. The detection method according to claim 10, further comprising: providing the first signal of the touch signal lines to data lines, which comprises: sequentially providing the first signal of the touch signal lines to the data lines at preset position intervals from left to right or from right to left according to wiring positions of the data lines, a preset position interval being b data lines, b being an integer greater than or equal to 0.

* * * * *